United States Patent [19]

Yoshida

[11] Patent Number: 5,712,175
[45] Date of Patent: Jan. 27, 1998

[54] METHOD OF MAKING SEMICONDUCTOR DEVICE HAVING A SCHOTTKY GATE ELECTRODE

[75] Inventor: Kazuhiro Yoshida, Shiga-ken, Japan

[73] Assignee: Murata Manufacturing Co., Ltd., Nagaokakyo, Japan

[21] Appl. No.: 524,208

[22] Filed: Sep. 6, 1995

[30] Foreign Application Priority Data

Sep. 12, 1994 [JP] Japan .................. 6-217513

[51] Int. Cl.$^6$ ........................................ H01L 21/441
[52] U.S. Cl. ........................................ 437/39; 437/175
[58] Field of Search ....................... 437/39, 405 H, 437/415 H, 175; 148/DIG. 139, DIG. 140

[56] References Cited

U.S. PATENT DOCUMENTS

| | | | |
|---|---|---|---|
| 4,959,326 | 9/1990 | Roman et al. | 437/39 |
| 5,147,812 | 9/1992 | Gilbert et al. | 437/405 H |
| 5,185,277 | 2/1993 | Tung et al. | 437/175 |

FOREIGN PATENT DOCUMENTS

| | | |
|---|---|---|
| 0 591 646 | 4/1994 | European Pat. Off. . |
| 59-135773 | 8/1984 | Japan . |
| 4-14212 | 1/1992 | Japan . |
| 6-104285 | 4/1994 | Japan . |

*Primary Examiner*—Chandra Chaudhari
*Attorney, Agent, or Firm*—Burns, Doane, Swecker & Mathis, LLP

[57] ABSTRACT

A method of manufacturing a semiconductor device using an inexpensive apparatus such as an i-line stepper, with a high throughput and a high yield at a low cost. Exemplary embodiments of the method include a step for forming a first layer of an insulative film on a semiconductor substrate, a step of forming a second layer of a resist for gate patterning on the first layer of the insulative film, a step of forming a pattern having a desired gate length on the second layer of the resist, a step of transcribing a gate pattern in the first layer of the insulative film by an anisotropic etching, and a step of patterning a cap of a mushroom-type gate electrode or an eave of a Γ-type electrode by using a third layer of a resist.

20 Claims, 4 Drawing Sheets

METHOD OF MAKING SEMICONDUCTOR DEVICE HAVING A SCHOTTKY GATE ELECTRODE

BACKGROUND OF THE INVENTION

1. Field of the Invention

The present invention relates to a method of making a semiconductor device, particularly to a method of making a gate electrode of a field-effect transistor.

2. State of the Art

Generally, it is necessary for improving high-frequency characteristics of a field-transistor (FET) to reduce a gate resistance (Rg), a source resistance (Rs) and a source-gate capacitance (Cgs) and to promote a mutual conductance (gm). Shortening the length of the gate is effective for reducing the source-gate capacitance (Cgs) and promoting the mutual conductance (gm). Further, a mushroom structure of the gate is effective in preventing the gate resistance from increasing when shortening the length of the gate.

Conventionally, a FET including a mushroom type gate electrode with a gate length on the order of a sub-half micron has been realized by an electron beam (EB) exposure device etc. An outline of manufacturing steps are shown in FIG. 13 and FIG. 14. In these Figures a two-stage exposure is performed by using an electron beam 23a and an electron beam 23b having different intensities to form a post 27a and a cap 27b of a mushroom-type gate electrode 27 in a resist 22 coated on the surface of a semiconductor substrate 21. Next, the resist 22 is developed, a mushroom shape 23 is formed in the resist 22 on which a gate metal is deposited by evaporation, and the resist 22 is lifted off by which the mushroom-type gate electrode 27 is provided as shown in FIG. 14.

However, the conventional EB exposure device is produced with a poor throughput and a high apparatus cost and therefore, the product cost is enhanced.

SUMMARY OF THE INVENTION

It is an object of the present invention to provide a method of making a semiconductor deice capable of manufacture with a high throughput and a high yield at a low cost by an inexpensive apparatus such as an i-line stepper.

It is another object of the present invention to provide a method of making a semiconductor device having an improved element characteristic which is capable of accurately forming a gate electrode by reducing a dispersion of dimensions by rendering a thickness of a first layer of an insulative film formed in a Schottky gate electrode forming region approximately equal to thicknesses of at least one of a source electrode and a drain electrode in an ohmic contact.

According to a first aspect of the present invention, there is provided a method of making a semiconductor device having a Schottky gate on a semiconductor substrate including;

1. a step of forming a first layer of an insulative film on a semiconductor substrate,
2. a step of coating a second layer of a resist for performing a gate patterning on the first layer of insulative film,
3. a step of forming a gate pattern having a desired gate length on the second layer of the resist,
4. a step of transcribing the gate pattern in the first layer of insulative film by an anisotropic etching, and
5. a step of coating a third layer of a resist for forming a mushroom-type gate electrode and patterning its cap.

According to a second aspect of the present invention, there is provided a method of making a semiconductor device of the first aspect wherein step 1 includes:

a step of forming a silicon nitride film (SiNx, such as SiN, $SiN_2$ and so forth), and/or a silicon oxide film ($SiO_2$) or any single or multi-layered structure, for the first layer of the insulative film.

According to a third aspect of the present invention, there is provided a method of making a semiconductor device having a Schottky gate electrode on a semiconductor substrate including:

1. a step of forming a first layer of an insulative film on a semiconductor substrate,
2. a step of coating a second layer of a resist for a gate patterning on the first layer of the insulative film,
3. a step of forming a gate pattern having a desired (e.g., predetermined) gate length on the second layer of the resist,
4. a step of transcribing the gate pattern on the first layer of the insulative film by an anisotropic etching, and
5. a step of coating a third layer of a resist for forming a Γ-type gate electrode, of which a post is proximate to a side of a source electrode and of which an eave is provided on a side of a drain electrode, and patterning the eave dislocated on the side of the drain electrode in the third layer of the resist.

In accordance with exemplary embodiments of the present invention, exposure is performed on the first layer of the insulative film that has been flattened and therefore, a sub-half micron gate electrode can stably be formed with a high throughput. Further, it is not necessary to remove the second layer of the resist in later steps and therefore, the steps can be shortened and the manufacturing cost can be reduced. The mushroom-type gate electrode or the Γ-type gate electrode can be formed by a single vapor deposition and therefore, the steps can be shortened, the cost for used material can be restrained and the manufacturing cost can be reduced. Further, the cap of the mushroom-type gate electrode and the eave(s) of the Γ-type gate electrode(s) can be separately exposed. Therefore, the cap and the eaves can be formed offset from the post of the gate electrode, the interval between the source and the gate can be narrowed while maintaining the gate resistance (Rg) low, and the source-gate capacitance (Cgs) and the source resistance (Rs) can be reduced.

BRIEF DESCRIPTION OF THE DRAWINGS

The present invention can be further understood with reference to the following description and the appended drawings, wherein like elements are provided with the same reference numerals. In the drawings.

DETAILED DESCRIPTION OF THE PREFERRED EMBODIMENTS

An explanation will be given of a first exemplary embodiment of the present invention with reference to FIG. 1 to FIG. 8.

Figure 1:
FIG. 1 shows a step of forming an ohmic electrode on a semiconductor substrate to illustrate a first exemplary embodiment (FIG. 1 through FIG. 8) of the present invention.

As shown in FIG. 1, numeral 1 designates a semiconductor substrate. An active layer (not shown) is formed on the surface of the semiconductor substrate 1. A source electrode 2a and a drain electrode 2b are formed on the semiconductor substrate 1 on which the active layer has been formed, with an ohmic contact therebetween.

Figure 2:
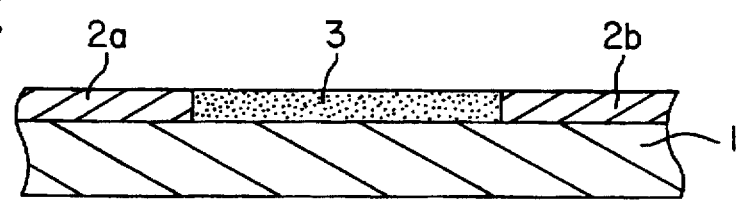
FIG. 2 shows a step of forming a first layer of a resist and flattening it.

As shown in FIG. 2, a first layer of an insulative layer 3 of a resist having a thickness that is equal to or greater than thickness of at least one of the source electrode 2a and the drain electrode 2b is spincoated in a gate electrode forming region between the source electrode 2a and the drain electrode 2b and is flattened (for example, etched). The first layer of the insulative film 3 can be etched back by reactive ion etching (RIE), a milling apparatus etc.

Figure 3:
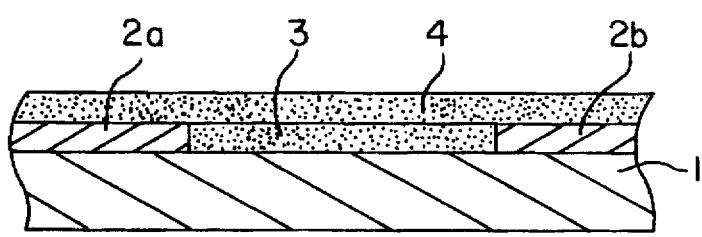
FIG. 3 shows a step of forming a second layer of a resist.

As shown in FIG. 3 a second layer of a resist 4 for gate patterning is spincoated. In this case, the film thickness of the second layer of resist 4 is set to any film thickness having high exposure sensitivity for an i-line stepper. Further, to avoid mixing of the first layer of the resist 3 with the second layer of the resist 4, a treatment by baking at high temperatures, for example, 200° C. or by $CF_4$ plasma can be performed on the first layer of the insulative film 3.

Figure 4:
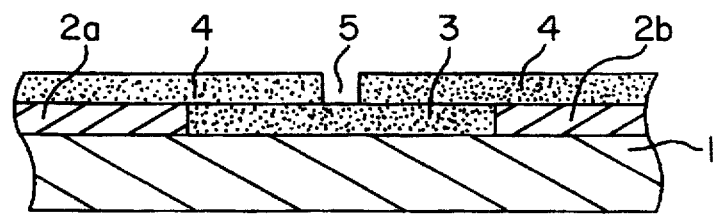
FIG. 4 shows a step of exposing a gate pattern on the second layer of the resist and developing it.

As shown in FIG. 4 a gate pattern 5 is exposed on the second layer of the resist 4 and is developed.

Figure 5:
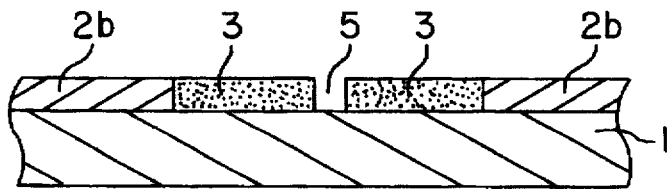
FIG. 5 shows a step of transcribing the gate pattern in the first layer of the resist while etching the second layer of the resist.

As shown in FIG. 5 the gate pattern 5 is transcribed in the first layer of the insulative film 3 while etching the second layer of the resist 4 under an anisotropic etching condition. With regard to the etching condition, an anisotropic etching utilizing accumulated substances on the side wall can be used. For example, it can be an etching using a fluorocarbon group gas by RIE.

Figure 6:
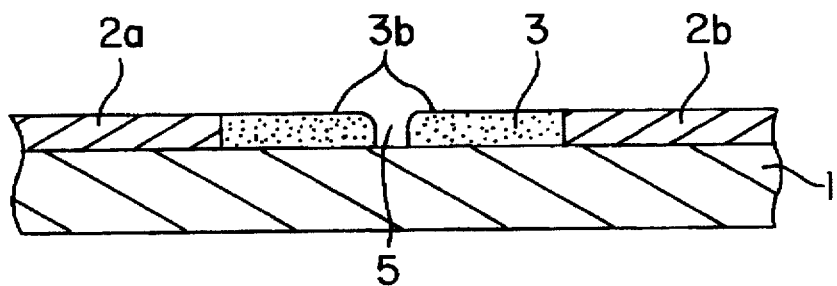
FIG. 6 shows a step of reflowing the resist for rounding corners of the gate pattern.

As shown in FIG. 6 a resist reflow (heating in an oven at 200° C. for 30 minutes) is performed to round corners 3b of the gate pattern 5 of the first layer of the insulative film 3. These steps are performed to avoid disconnection by rounding a portion of a mushroom-type gate electrode in connection with a stand and a cap thereof (which corresponds to the corner portions 3b which are to be formed).

Figure 7:
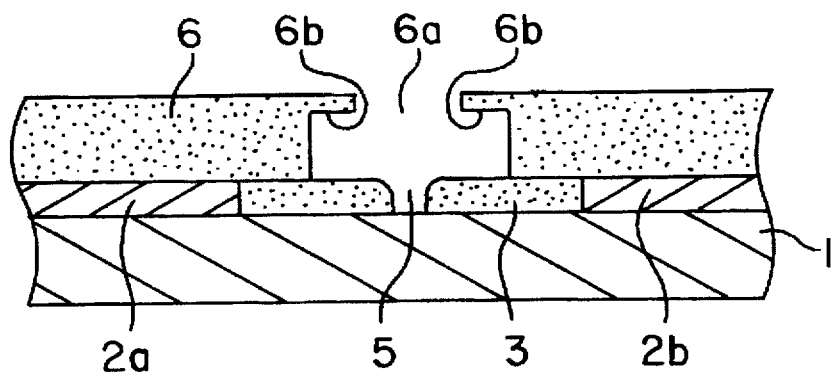
FIG. 7 shows a step of coating a third layer of a resist for forming a cap of a mushroom-type gate electrode and exposing and developing it.

As shown in FIG. 7, a third layer of a resist 6 is coated for forming the cap of the mushroom-type gate electrode. An opening 6a is formed by performing exposure and development. Eaves 6b can be formed by, for example, chlorobenzene treatment or a multi-layer resist method to facilitate the lifting-off.

Figure 8:
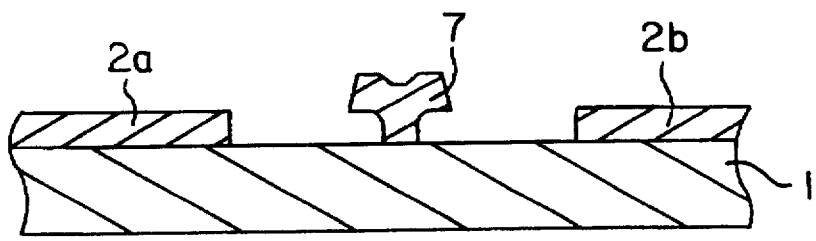
FIG. 8 shows a step of forming the mushroom-type gate electrode by depositing a gate metal by evaporation and by lifting off the first layer of the resist, and third layer of the resist and unnecessary metals thereon.

As shown in FIG. 8 a gate metal is deposited by evaporation, and the first layer of insulative film 3 and the third layer of resist 6 and unnecessary deposited metals thereon are lifted off, thereby forming a mushroom-type gate electrode 7.

Further, in the step illustrated in FIG. 2 of the first embodiment, the first layer of insulative film 3 is formed as a single layer or a multi-layer, and made from one or more materials selected from the group consisting of, for example, a silicon nitride (SiNx) film, a silicon oxide ($SO_2$) film, and a resist film. The first layer can be formed with a thickness approximately equal to those of the source electrode 2a and the drain electrode 2b, and can be formed in the gate electrode forming region as a single layer or a multi-layer structure by a film forming technique such as sputtering, vapor deposition, chemical vapor deposition (CVD) etc.

Next, an explanation will be given of a second exemplary embodiment with reference to FIGS. 9 through 11.

Generally, an interval between a source and a gate is often made narrower than that between a drain and the gate to improve noise characteristics. In this case, for a gate electrode having the mushroom-type structure, the interval between one side portion of a cap of the mushroom-type gate electrode and a source electrode becomes narrow, whereby the source-gate capacitance (Cgs) may not be negligible. Accordingly, an exemplary embodiment of the present invention solves the problem by providing a Γ-type gate electrode in which a source side portion of a cap of the mushroom-type gate electrode is dispensed with, and an eave is provided only on the side of the drain.

The steps illustrated in FIG. 1 through FIG. 3 in the first embodiment are the same in the second embodiment, and therefore the explanation will be omitted while attaching the same notations to the elements. An explanation will thus be given to the steps thereafter.

Figure 9:
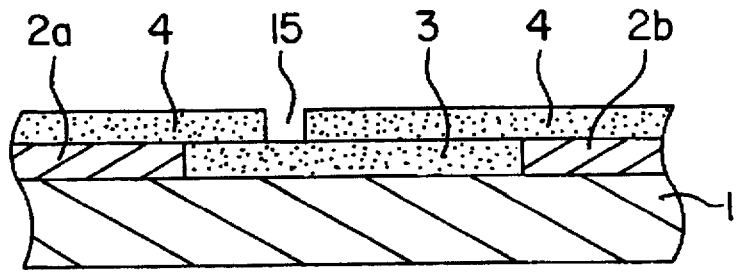
FIG. 9 shows a step of exposing and developing a gate pattern deviated on a side of a source electrode of a second layer of a resist to illustrate a second exemplary embodiment (FIG. 9 through FIG. 12) of the present invention.

As shown in FIG. 9 exposure and development of a gate pattern 15 is performed at a portion of the second layer of the resist 4 that is deviated toward the source electrode 2a.

Figure 10:
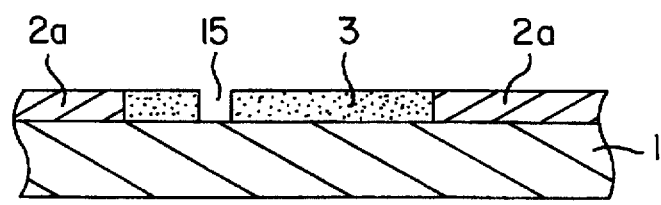
FIG. 10 shows a step of etching the second layer of the resist and at the same time transcribing the gate pattern on a first layer of a resist under an anisotropic etching condition.

As shown in FIG. 10, the second layer of the resist 4 is etched and at the same time the gate pattern 15 is transcribed in the first layer of the insulative film 3 under an anisotropic etching condition.

Figure 11:
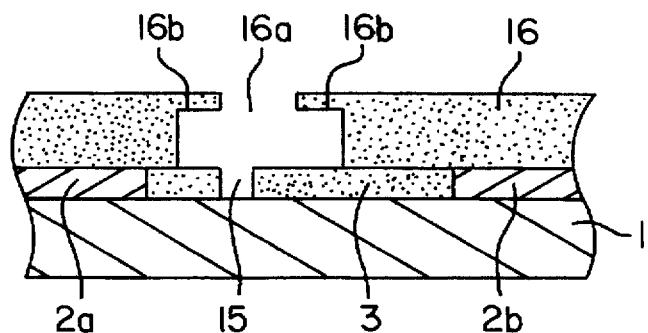
FIG. 11 shows a step of coating a third layer of a resist for forming a Γ-type gate electrode and exposing and developing an opening dislocated on a side of the drain electrode with respect to the gate pattern.

As shown in FIG. 11, a third layer of a resist 16 is coated for forming a Γ-type gate electrode. Further, an opening 16a that is dislocated toward the side of the drain electrode 2b with respect to the gate pattern 15 is exposed and developed. Eaves 16b can be formed by, for example, a chlorobenzene treatment or a multi-layer resist method to facilitate the lifting-off.

Figure 12:
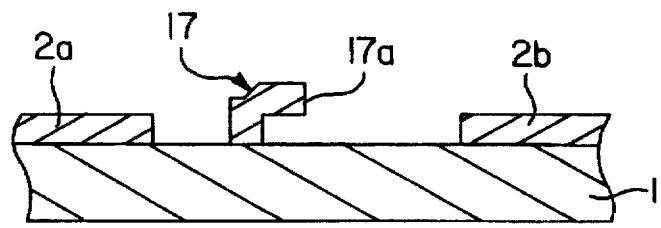
FIG. 12 shows a step for forming the Γ-type gate electrode 7 in which an eave is formed on the side of a drain electrode by depositing a gate metal by evaporation and by lifting off the first layer of the resist, the third layer of the resist and unnecessary metals thereon.
Figure 13:
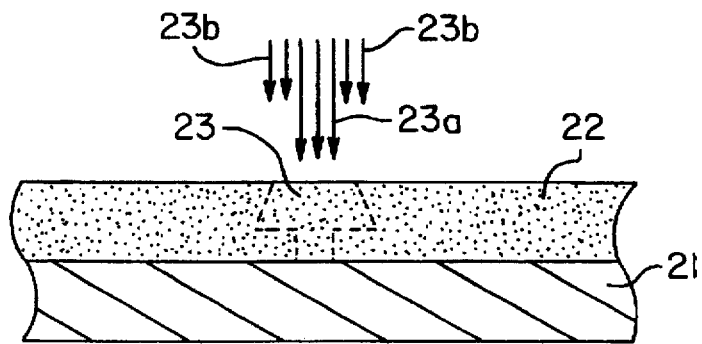
FIG. 13 shows a step of electron beam exposing a mushroom-type gate electrode in a resist for the electron beam in accordance with a conventional manufacturing method (FIG. 13 and FIG. 14)
Figure 14:
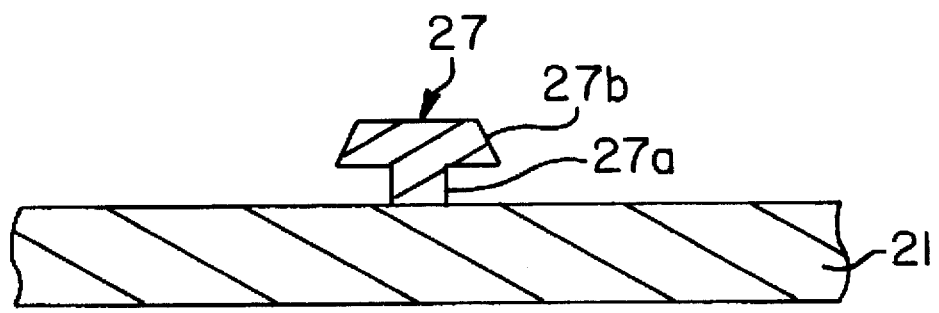
FIG. 14 shows a step of forming the mushroom-type gate electrode by depositing a gate metal by evaporation and lifting off the resist.

As shown in FIG. 12, a gate metal is deposited by evaporation. Further, the first layer of the insulative film 3 and the third layer of the resist 16 and unnecessary deposited metals thereon are lifted off, thereby forming a Γ-type gate electrode 17 having an eave 17a on the side of the drain electrode.

In the present invention a sub-half micron gate electrode can stably be formed with a high throughput since exposure is performed on the flat first layer of the insulative film. Further, it is not necessary to remove the second layer of the resist in later steps. Therefore, the steps can be shortened and the manufacturing cost can be reduced. Further, a mushroom-type gate electrode or a Γ-type gate electrode can be formed by a single step of vapor deposition, and therefore the steps can be shortened, used material can be saved and the manufacturing cost can be reduced. Further, the cap of the mushroom-type gate electrode and the eave of the Γ-type gate electrode can be separately exposed and therefore, the interval between the source and the gate can be narrowed and the source resistance (Rs) can be reduced while maintaining low gate resistance (Rg) and source-gate capacitance (Cgs), by offsetting the cap or the eaves with respect to the post of the gate electrode.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of making a semiconductor device having a Schottky gate electrode on a semiconductor substrate comprising the steps of:

forming a first layer of an insulative film on the semiconductor substrate;

forming a second layer of a resist for a gate patterning on the first layer of the insulative film;

forming a gate pattern on the second layer of the resist;

transcribing the gate pattern in the first layer of the insulative film by anisotropic etching; and after said transcribing step, forming a third layer of a resist for forming a mushroom-type gate electrode and patterning a cap portion of the mushroom-type gate electrode.

2. The method of making a semiconductor device according to claim 1, wherein the step of forming a first layer further comprises the step of:

forming a first layer of an insulative film with one or more materials selected from the group consisting of a silicon nitride film, a silicon oxide film, and a resist film.

3. A method of making a semiconductor device according to claim 1, further comprising the step of:

forming a source electrode and a drain electrode on the semiconductor substrate, said first layer of insulative film being formed with a thickness approximately equal to a thickness of at least one of said source electrode and said drain electrode.

4. A method of making a semiconductor device according to claim 3, wherein said first layer of insulative film is formed between said source electrode and said drain electrode.

5. A method of making a semiconductor device according to claim 1, wherein said step of forming a gate pattern further includes the step of:

forming said gate pattern with a predetermined gate length on the second layer of the resist.

6. A method of making a semiconductor device according to claim 1, further comprising the step of:

forming the mushroom-type gate electrode by vapor deposition.

7. A method of making a semiconductor device according to claim 1, wherein said step of forming a first layer further includes the steps of:

coating said semiconductor substrate with said insulative film; and etching said insulative film.

8. A method of making a semiconductor device according to claim 1, wherein said step of forming a second layer further includes a step of:

forming said second layer with a thickness based on exposure sensitivity of an i-line stepper.

9. A method of making a semiconductor device according to claim 1, further comprising the step of:

rounding corners of the gate pattern transcribed in said first layer of the insulative film using a resist reflow.

10. The method of making a semiconductor device according to claim 1, further comprising the steps of:

forming said mushroom-type gate electrode with a gate metal deposited by evaporation.

11. A method of making a semiconductor device having a Schottky gate electrode on a semiconductor substrate comprising the steps of:

forming a first layer of an insulative film on the semiconductor substrate;

forming a second layer of a resist for a gate patterning on the first layer of the insulative film;

forming a gate pattern on the second layer of the resist;

transcribing the gate pattern in the first layer of the insulative film by an anisotropic etching;

after said transcribing step, forming a third layer of a resist for forming a Γ-type gate electrode with a post proximate to a side of a source electrode and with an eave proximate to a side of a drain electrode; and patterning the eave proximate to the side of the drain electrode on the third layer of the resist.

12. The method of making a semiconductor device according to claim 11, further comprising a step of:

forming said first layer of said insulative film with a thickness approximately equal to a thickness of at least one of said source electrode and said drain electrode.

13. A method of making a semiconductor device according to claim 12, wherein said first layer of insulative film is formed between said source electrode and said drain electrode.

14. A method of making a semiconductor device according to claim 11, wherein said step of forming a gate pattern further includes the step of:

forming said gate pattern with a predetermined gate length on the second layer of the resist.

15. A method of making a semiconductor device according to claim 11, further comprising the step of:

forming the Γ-type gate electrode by vapor deposition.

16. A method of making a semiconductor device according to claim 11, wherein said step of forming a first layer further includes the steps of:

coating said semiconductor substrate with said insulative film; and etching said insulative film.

17. The method of making a semiconductor device according to claim 11, wherein the step of forming a first layer further comprises the step of:

forming a first layer of an insulative film with one or more materials selected from the group consisting of a silicon nitride film, a silicon oxide film, and a resist film.

18. A method of making a semiconductor device according to claim 11, wherein said step of forming a second layer further includes a step of:

forming said second layer with a thickness based on exposure sensitivity of an i-line stepper.

19. The method of making a semiconductor device according to claim 11, further comprising the step of:

forming said eave by at least one of a chlorobenzene treatment and a multi-layer resist method.

20. A method of making a semiconductor device according to claim 11, further comprising the step of:

forming said Γ-type gate electrode with a gate metal deposited by evaporation.

* * * * *